United States Patent
Oi

(10) Patent No.: US 7,323,355 B2
(45) Date of Patent: Jan. 29, 2008

(54) METHOD OF FORMING A MICROELECTRONIC DEVICE

(75) Inventor: Hideo Oi, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 391 days.

(21) Appl. No.: 11/088,387

(22) Filed: Mar. 23, 2005

(65) Prior Publication Data

US 2006/0216846 A1  Sep. 28, 2006

(51) Int. Cl.
*H01L 21/00* (2006.01)

(52) U.S. Cl. .................................. 438/51; 438/459

(58) Field of Classification Search ............ 438/50–55, 438/455–460, 464
See application file for complete search history.

(56) References Cited

U.S. PATENT DOCUMENTS

| | | | | |
|---|---|---|---|---|
| 5,798,557 | A * | 8/1998 | Salatino et al. | 257/704 |
| 6,391,742 | B2 * | 5/2002 | Kawai | 438/456 |
| 6,514,789 | B2 | 2/2003 | Denton et al. | |
| 6,660,564 | B2 * | 12/2003 | Brady | 438/119 |
| 6,841,453 | B2 * | 1/2005 | Mastromatteo | 438/455 |
| 7,008,817 | B2 * | 3/2006 | Kim et al. | 438/456 |
| 7,071,016 | B2 * | 7/2006 | Park et al. | 438/48 |
| 2002/0031854 | A1 * | 3/2002 | Walker | 438/49 |
| 2004/0102021 | A1 | 5/2004 | Sawyer et al. | |

\* cited by examiner

*Primary Examiner*—Kevin M. Picardat
(74) *Attorney, Agent, or Firm*—Ingrassia, Fisher & Lorenz, P.C.

(57) ABSTRACT

A method of forming a microelectronic device (300) including the steps of forming a sensor component (100) and a capping component (200). The sensor component (100) includes a sensor structure (150, 152) and a conductive trace (160, 162) formed on a first SOI semiconductor wafer (110). The capping component (200) includes a plurality of capping layers (230, 232) formed on a second SOI semiconductor wafer (210). During fabrication the capping component (200) is bonded to the sensor component (100) prior to fabrication of a through hole (260) in the capping component (200). Subsequent to bonding the two components together, wafer thinning removes a handle layer (112) of the first SOI semiconductor wafer (110) and a handle layer (212) of the second SOI semiconductor wafer (210). A through hole (260) is etched in the capping component (200) using a buried oxide layer (214) of the second SOI semiconductor wafer (220) as a hard mask (250), thereby exposing the conductive trace (160, 162) formed as a part of the sensor component (100).

19 Claims, 3 Drawing Sheets

METHOD OF FORMING A MICROELECTRONIC DEVICE

TECHNICAL FIELD OF THE INVENTION

The present invention generally relates to electronic components and more particularly, to a method of forming a microelectronic device including a capping component for protection of micromachined devices.

BACKGROUND OF THE INVENTION

It is generally desirable that microelectronic devices, such as sensors and integrated circuits, are required to be thin in order to be competitive in the consumer market place. Some microelectronic devices combine what is traditionally a two-chip design: a micromachined device, such as a g-cell sensor (accelerometer), and an integrated circuit, such as an ASIC (Application Specific Integrated Circuit). Many prior art devices have included the use of a capping component bonded to a semiconductor wafer component for protection of the micromachined devices formed thereon.

One possible means of achieving the required thinness for these component parts is through wafer thinning. During fabrication, the semiconductor wafer and the capping component undergo separate wafer thinning processes prior to assembly. Often these wafer thinning processes result in thin components that are susceptible to damage during the remaining fabrication processes and handling.

As an example, during current fabrication techniques, wafer thinning of the substrate, or a sensor component, is completed prior to release of the movable sensor structure. It is very difficult to handle these thinned sensor components reliably without damaging the sensor structure. Wafer thinning and through holes for electrically connecting the sensor structure to external circuitry are formed in the capping component prior to bonding of the sensor component and the capping component. Physical wafer thinning processes, such as chemical or mechanical grinding, cannot be performed after the through hole openings are formed on the capping component due to the susceptibility of the wafer to breakage during this process. Due to these thinning and through hole fabrication steps, it is difficult to handle the capping component prior to bonding of the two components into a combined wafer structure.

Accordingly, it would be desirable to provide for method of forming a microelectronic device utilizing a novel thinning process, thereby reducing the risk of wafer breakage during fabrication, that is compatible with standard semiconductor processes. The novel thinning method provides for a strong bonded wafer structure and provides for a device that is better able to withstand the manufacturing process. Other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description.

The present invention provides for novel method of forming a microelectronic device, and more particularly a method of forming a micromachined device, such as a g-cell sensor (accelerometer) which provides for the retention of the integrity of the device wafer during fabrication, thus preventing breakage, chipping, or the like, in the manufacturing environment.

Figure 1:
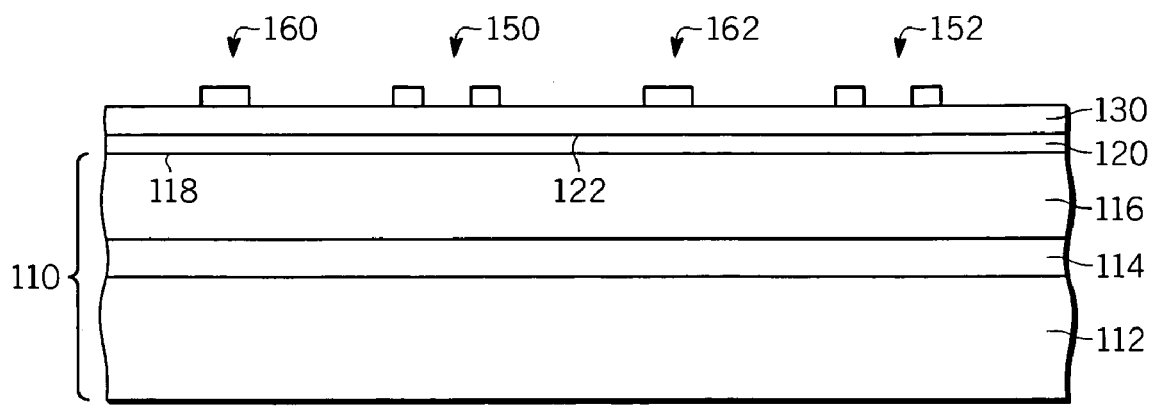
FIG. 1 is a cross-sectional view of a sensor component during processing in accordance with the present invention.
Figure 2:
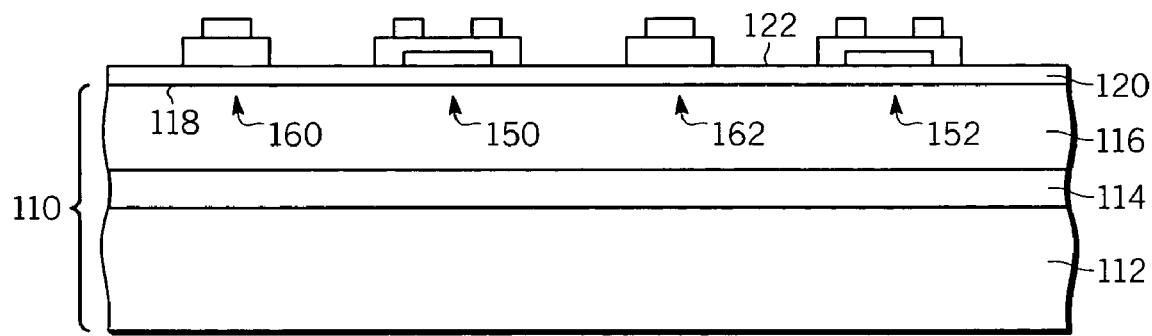
FIG. 2 is a cross-sectional view of the sensor component of FIG. 1 during a later stage of processing in accordance with the present invention.

Turning now to the drawings, FIGS. 1 and 2 are cross-sectional views a first component of a microelectronic device during processing in accordance with the present invention. FIG. 1 illustrates a sensor component 100, comprising a plurality of sensor structures 150 and 152 formed on a first semiconductor wafer 110. Sensor component 100 further includes electrically conductive traces 160 and 162 formed on first semiconductor wafer 110. FIG. 1 illustrates that present during this stage of fabrication is a sacrificial material 130 that is later removed as will be illustrated in FIG. 2.

In the preferred method of fabrication, the provided first semiconductor wafer 110 is a standard semiconductor-on-insulator (SOI) wafer well known in the art. SOI semiconductor wafer 110 includes a handle layer 112, a buried oxide layer 114, and an active layer of silicon 116. During fabrication of sensor component 100, a layer of field oxide 120 is grown on an uppermost surface 118 of semiconductor wafer 110, and more specifically grown on active layer of silicon 116, by thermal oxidation. Field oxide layer 120 isolates active layer 116 from the sensor structure that will be formed on an uppermost surface 122 of field oxide layer 120.

The plurality of sensor structures 150 and 152 and conductive traces 160 and 162 are formed on an uppermost surface 122 of field oxide layer 120 by surface micromachining techniques. Surface micromachining is well known in the art as a technique that builds up a structure in layers of thin films on the surface of a silicon wafer (or any other suitable substrate). Alternatively, sensor structures 150 and 152 and conductive traces 160 and 162 can be etched into uppermost surface 118 of semiconductor wafer 110 using a bulk micromachining technique. Bulk micromachining is a subtractive process in which a portion of an uppermost silicon layer is removed using anisotropic chemistries. When employing bulk micromachining, sensor structures 150 and 152 and conductive traces 160 and 162 would be formed in the surface of 118 of active layer 116.

FIG. 1 illustrates first SOI semiconductor wafer 110 as being the substrate for the fabrication of sensor structures 150 and 152 and more particularly, a base upon which the micromachined layers are built. The fabrication of sensor structures and conductive traces by micromachining is well known in the art, and will be described herein in general terms, without illustration of the individual process steps that form sensor structures 150 and 152, and conductive traces 160 and 162 of the present invention. The micromachining process employed herein would typically utilize films of two different materials: a structural material (commonly polysilicon) and a sacrificial material. These materials are deposited on surface 122 of field oxide layer 120 and dry etched in a specific sequence to define sensor structures 150 and 152 and conductive traces 160 and 162. In one example, during the micromachining process, a silicon nitride film is first deposited over field oxide layer 120 by low pressure chemical vapor deposition (LPCVD). This nitride film will protect field oxide layer 120 from a solution used to remove sacrificial materials at a later stage of fabrication. A polysilicon film, implanted with phosphorus, is next deposited on an uppermost surface of the nitride film by LPCVD. This polysilicon film layer is then patterned to define conductive traces 160 and 162 using standard photolithography and plasma etching techniques.

Next, a first phosphorous silicate glass (PSG1) film is deposited by plasma enhanced chemical vapor deposition (PECVD). PSG1 film is patterned as a lower-side stopper that is subsequently formed of another polysilicon film, using standard photolithography and wet etching techniques. PSG1 is removed during a later stage in fabrication to release sensor structures 150 and 152. A second PSG (PSG2) film is next deposited by PECVD and is patterned as an anchor contact hole using photolithography and plasma etching techniques. This PSG2 film will also be removed to release sensor structures 150 and 152 during a later stage of processing. A second polysilicon film is next deposited by LPCVD, and a third PSG film (PSG3) that will serve as a hard mask is deposited by PECVD on an uppermost surface of the second polysilicon film. The second polysilicon film will become the actual sensor structures 150 and 152. The PSG3 film, similar to the other PSG films, will be removed during later processing to release sensor structures 150 and 152.

Next, any polysilicon film that was deposited on a backside of wafer 110 is removed by dry etching. The pattern for sensor structures 150 and 152 is finally printed using photoresist and photolithography techniques. PSG3 film is etched along the previous patterned photoresist and the second layer of polysilicon is etched along the hard mask pattern by dry etching. To provide for a flat surface, two additional layers of PSG are next deposited by PECVD and etched to fill gaps formed in the polysilicon sensor structure and to form a flat surface. This flat PSG layer is patterned as a metal contact hole by wet etching.

To define conductive traces 160 and 162, a metal film is deposited by physical vapor deposition techniques (PVD) and patterned as a top-side stopper. Using photolithography and wet etching techniques, conductive traces 160 and 162 are defined and provide for wire bonding during later assembly. In the alternative, conductive traces 160 and 162 can be formed of a polysilicon material. At this stage of fabricating sensor component 100, electrical measurements are taken to verify that the wafer was processed under the proper conditions. FIG. 1 illustrates the resulting structure including sensor structures 150 and 152 and conductive traces 160 and 162, wherein the PSG films used during the micromachining process, illustrated as a sacrificial material 130, have yet to be removed.

FIG. 2 is a cross-sectional view of sensor component 100 of FIG. 1 during a later stage of processing in accordance with the present invention. It should be understood that the same reference numerals are used throughout the figures to denote the same elements. Subsequent to wafer testing of sensor component 100, sacrificial material 130 is removed by wet etching to release sensor structures 150 and 152. Typically this is accomplished by immersing sensor component 100 in a wet etch solution to etch away sacrificial material 130, thereby defining sensor structures 150 and 152 and conductive traces 160 and 162 on surface 122 of field oxide layer 120 and completing the fabrication of sensor component 100. It should be understood that while described in detail is the fabrication of a plurality of sensor structures and conductive traces to form sensor component 100, any number of sensor structures and conductive traces can be fabricated to form a sensor component, and ultimately a microelectronic device dependent upon the final device requirement.

Figure 3:
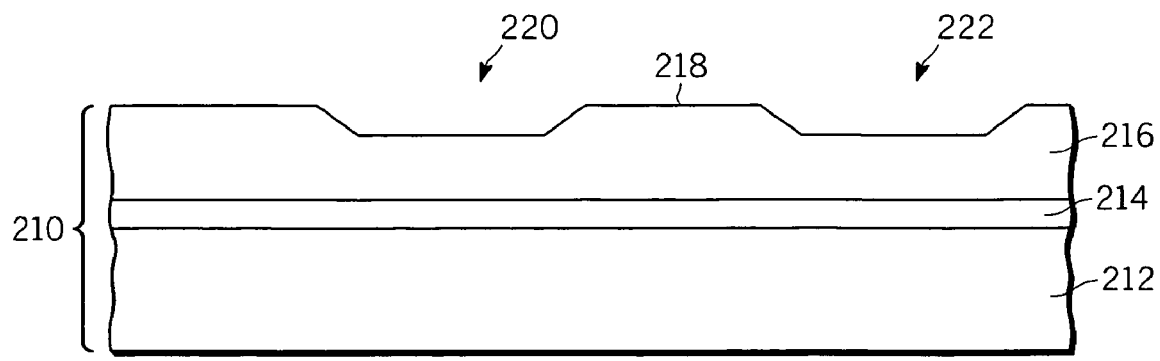
FIG. 3 is a cross-sectional view of a capping component during processing in accordance with the present invention.

FIG. 3 illustrates a cross-sectional view of a second component utilized in the fabrication of a microelectronic device in accordance with the present invention. The second component is a capping component 200 comprising a second semiconductor wafer 210, such as a SOI semiconductor wafer, including a handle layer 212, a buried oxide layer 214, and an active layer of silicon 216. Semiconductor wafer 210 can be either an active or sacrificial SOI semiconductor wafer dependent upon device requirements.

A plurality of micro-cavities 220 and 222 are formed in an uppermost surface 218 of active layer of silicon 216 using anisotropic wet etching. Micro-cavities 220 and 222 will each provide a defined area in which sensor structures 150 and 152 of sensor component 100 will be hermetically sealed in the completed microelectronic device.

Figure 4:
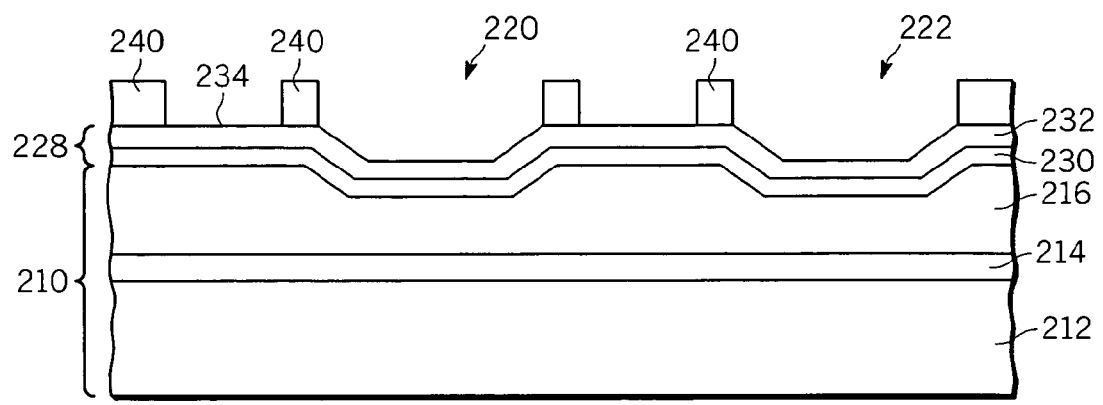
FIG. 4 is a cross-sectional view of the capping component of FIG. 3 during a later stage of processing in accordance with the present invention.

FIG. 4 illustrates a cross-sectional view of the capping component of FIG. 3 during a later stage of processing. Capping component 200 is further comprised of plurality of capping layers 228, and more specifically a layer of silicon dioxide ($SiO_2$) 230 and a silicon nitride film layer 232. Silicon dioxide layer 230 is grown on a surface 218 of active layer of silicon 216 using thermal oxidation. Next, silicon nitride film layer 232 is deposited on a surface of silicon dioxide layer 230 using LPCVD processing. Capping layers 228 provide for electrical isolation between capping component 200 and sensor component during later processing.

Capping component 200 has a bonding material 240 formed on an uppermost surface 234 of silicon nitride film layer 232 for subsequent bonding of capping component 200 to sensor component 100. Bonding material 240 is comprised of frit glass that is disposed on a portion of surface 234 of silicon nitride film layer 232 by screen-printing. Frit glass is a mixture of glass particles dispersed in an organic binder or solvent. After screen-printing, the frit glass is heated to volatilize the organic binder or solvent, and form bonding material 240 and complete fabrication of capping component 200. The use of frit glass is disclosed to achieve bonding between capping component 200 and sensor component 100, but other bonding materials or techniques may be utilized to bond the two components together such as thermocompression bonding, ultrasonic energy bonding, thermosonic bonding, or the like.

Figure 5:
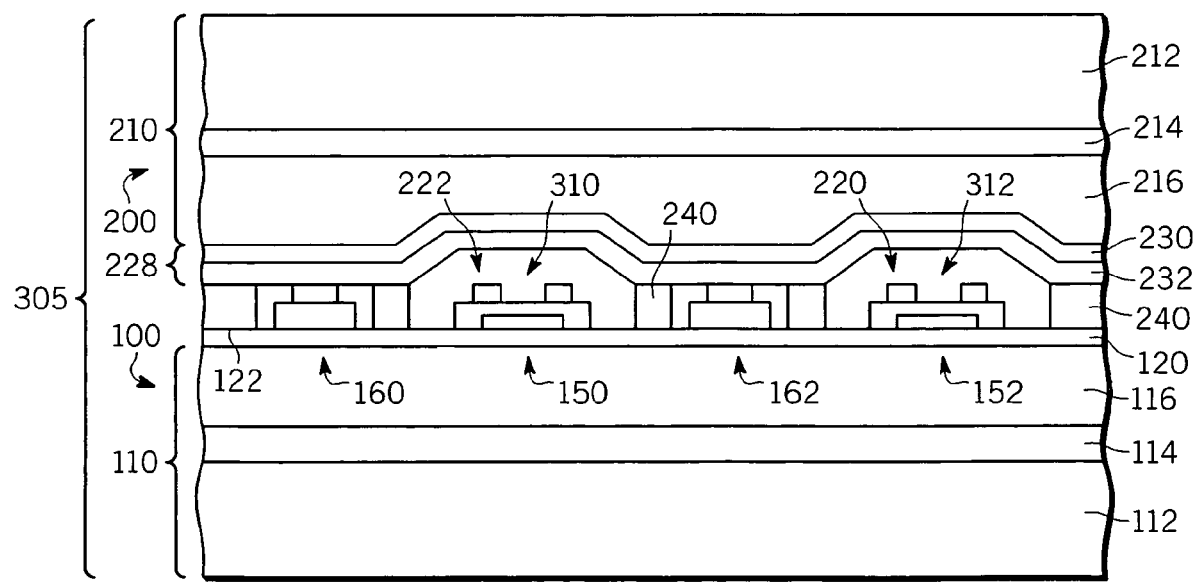
FIG. 5 is a cross-sectional view of a microelectronic device including the sensor component of FIG. 2 and the capping component of FIG. 4, during a later stage of processing in accordance with the present invention.

FIG. 5 a cross-sectional view of a microelectronic device 300, and more particularly sensor component 100 and capping component 200, during a later stage of processing in accordance with the present invention. At this point, both sensor component 100 and capping component 200 include their respective SOI semiconductor wafer substrates, 110 and 210, respectively. Capping component 200 is bonded to sensor component 100 using bonding material 240 and thereby forming a combined wafer structure 305. The bonding of capping component 200 and sensor component 100, in conjunction with micro-cavities 220 and 222 defined in capping component 200, provides for the fabrication of a plurality of hermetically sealed areas 310 and 312. Hermetically sealed areas 310 and 312 are defined by capping component 200, bonding material 240 and surface 122 of field oxide layer 120 deposited on surface 118 of first SOI semiconductor wafer 110. During the bonding process, capping component 200 is placed in contact with surface 122 of sensor component 100 via bonding material 240. Heat is applied, and bonding material 240 provides for bonding of sensor component 100 to capping component 200. Once capping component 200 and sensor component 100 are bonded and enclosed areas 310 and 312 are defined, sensor structures 150 and 152 are hermetically sealed within areas 310 and 312, respectively.

During this stage of fabrication, sensor component 100 and capping component 200 include their respective SOI semiconductor wafer substrates, 110 and 210, respectively, and are bonded together to form combined wafer structure 305. Prior to the release etch of sensor structures 150 and 152, SOI semiconductor wafer 110, and more particularly handle layer 112 of SOI semiconductor wafer 110, is optionally thinned to a preferred thickness for later process handling, yet remains substantially intact. Additionally, handle layer 212 of capping component 200 can be optionally ground to a proper handling thickness prior to bonding with sensor component 100, using standing grinding practices well known in the art. It should be understood that during this optional thinning process, substantial portions of handle layers 112 and 212 remain as a part of microelectronic device structure 300, thereby reducing breakage and chipping of the structure.

Figure 6:
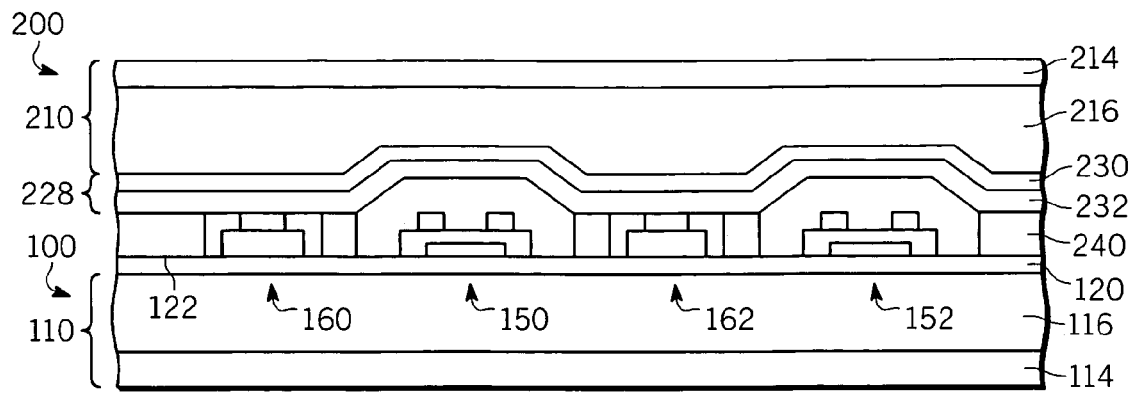
FIG. 6 is a cross-sectional view of the microelectronic device of FIG. 5 during a later stage of processing in accordance with the present invention.

FIG. 6 is a cross-sectional view of microelectronic device 300 of FIG. 5 during a later stage of processing in accordance with the present invention. Subsequent to the bonding of sensor component 100 and capping component 200 to form a combined wafer structure, and more particularly device 300, the structure is placed in a wet etch solution comprising an etchant such as tetramethylammonium hydroxide (TMAH). During this etching process, the remaining portions of handle layer 112 of SOI semiconductor wafer 110 and handle layer 212 of SOI semiconductor wafer 210 are removed. Active layers of silicon 116 and 216, and buried oxide layers 114 and 214, of SOI semiconductor wafers 110 and 210, respectively, remain intact. The etching process will selectively stop at buried oxide layers 114 and 214. Microelectronic device 300 remains thick enough to be handled during the remaining processing steps without breakage or chipping.

Figure 7:
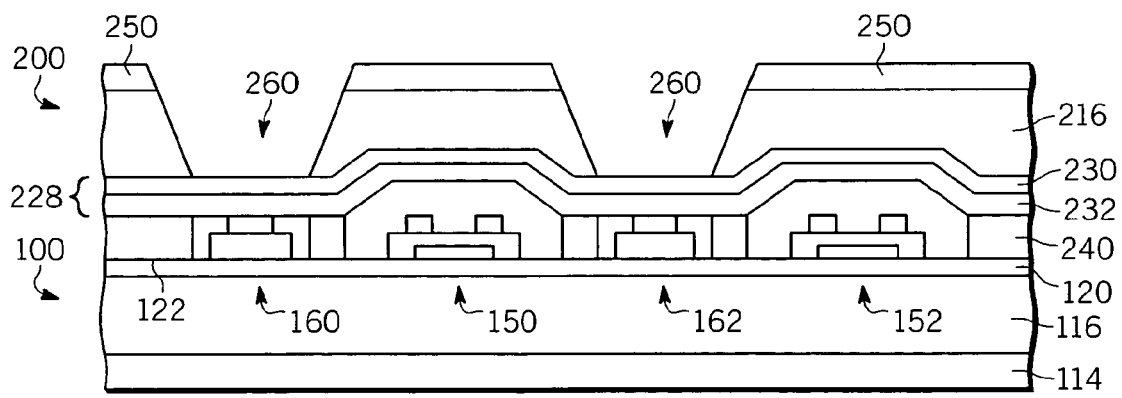
FIG. 7 is a cross-sectional view of the microelectronic device of FIG. 6 during a later stage of processing in accordance with the present invention.

FIG. 7 is a cross-sectional view of microelectronic device 300 of FIG. 6 during a later stage of processing in accordance with the present invention. A photoresist mask (not shown) is next printed on remaining oxide layer 214 (FIG. 6) of capping component 200. The photoresist mask provides for etching of oxide layer 214 to form a hard mask 250 as illustrated in FIG. 7. Hard mask 250 will provide for etching of a plurality of through holes 260 in capping component 200. Once hard mask 250 is formed and the photoresist is removed, through holes 260 are formed by placing device 300 in a wet etch solution of TMAH. The unmasked portion of remaining semiconductor layers 214 and 216 are etched away to form through holes 260. Capping layers 228 and more specifically, oxide layer 230 and nitride layer 232 that were formed on a surface of second semiconductor wafer 210 act as an etch stop for this stage of etching through holes 260. Once complete, through holes 260 will provide for the exposure of conductive traces 160 and 162 formed as a part of sensor component 100.

Figure 8:
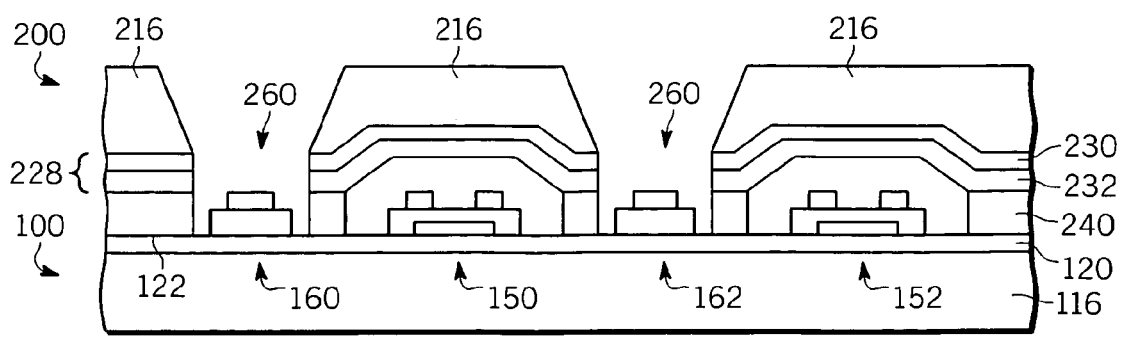
FIG. 8 is a cross-sectional view of the microelectronic device of FIG. 7 during a final stage of processing in accordance with the present invention.

FIG. 8 is a cross-sectional view of microelectronic device 300 of FIG. 7 during a final stage of processing in accordance with the present invention. To complete fabrication of microelectronic device 300, the combined wafer structure is dry etched using an etch process such as Reactive Ion Etching (RIE) or a Deep Reactive Ion Etching (DRIE) to complete the plurality of through holes 260. During the etching process, oxide layer 230 and nitride layer 232 of capping component 200 are etched away to completely define through holes 260. In addition, oxide layer 114 of first semiconductor wafer 110 is etched away from sensor component 100. Access to conductive traces 160 and 162 is thus easily performed by the definition of through holes 260 subsequent to the bonding together of sensor component 100 and capping component 200. By defining through holes 260 subsequent to the bonding of sensor component 100 and capping component 200, wafer breakage is minimized.

Accordingly, provided is a method of forming a microelectronic device including a wafer thinning process that is performed subsequent to bonding of a sensor component 100 and a capping component 200 into a combined wafer structure. The method of forming a microelectronic device comprises the steps of: forming a sensor component, comprising a sensor structure and a conductive trace on a first SOI semiconductor wafer. Next, a capping component, comprising a capping layer is formed on a second SOI semiconductor wafer. The first SOI semiconductor wafer is then bonded to the second SOI semiconductor wafer. The first SOI semiconductor wafer and the second SOI semiconductor wafer undergo a wafer thinning process subsequent to bonding first SOI semiconductor wafer to the second SOI semiconductor wafer. A through hole is next formed in the capping component to expose the conductive trace formed on the first SOI semiconductor wafer. The microelectronic device is disclosed as a g-cell sensor (accelerometer). The step of forming a sensor component further includes the step of etching away a sacrificial material formed during fabrication of the sensor structure and the conductive trace to release the sensor structure and the conductive trace. The capping layer includes an oxide layer and a nitride layer. The second SOI semiconductor wafer comprises one of an active or sacrificial SOI semiconductor wafer. The step of bonding the first SOI semiconductor wafer to the second SOI semiconductor wafer includes forming a bonding material comprised of frit glass on a surface of the plurality of capping layers. The sensor structure is enclosed within a hermetically sealed area formed by the capping component, the bonding material and a surface of a field oxide layer deposited on an uppermost surface of the first SOI semiconductor wafer. The step of wafer thinning the first SOI semiconductor wafer and the second SOI semiconductor wafer includes etching away a plurality of handle layer using a buried oxide layer of each of the first and second SOI semiconductor wafers as an etch stop. The step of forming a through hole further comprises the step of using the buried oxide layer in the second SOI semiconductor as a hard mask during wet etching of the through hole. The step of forming a through hole in the capping component further includes dry etching the plurality of capping layers to expose the conductive trace and provide for electrical connection.

In addition, provided is a method of forming a microelectronic device comprising the steps of: forming a sensor component, comprising a sensor structure and a conductive trace formed on a first wafer, the first wafer including a handle layer, a buried oxide layer and an active layer of silicon; and forming a capping component, comprising an oxide layer and a nitride layer formed on a second wafer, the second wafer including a handle layer, a buried oxide layer and an active layer of silicon. The first wafer is next bonded to the second wafer. The handle layer of the first wafer and the handle layer of the second wafer are etched away subsequent to bonding the first wafer to the second wafer. A plurality of through holes are next etched in the capping component using the buried oxide layer in the second wafer as a hard mask to expose the conductive trace formed on the first wafer. The second wafer comprises one of an active or sacrificial SOI semiconductor wafer. The sensor structure is enclosed within a hermetically sealed area formed by the capping component, the bonding material and a surface of a field oxide layer deposited on an uppermost surface of the first wafer. The step of etching away the handle layer of the first wafer and the handle layer of the second wafer includes wet etching with tetramethylammonium (TMAH).

Finally, provided is a method of forming a g-cell sensor comprising the steps of: forming a sensor component on a first SOI semiconductor wafer; forming a capping component on a second SOI semiconductor wafer; bonding the first SOI semiconductor wafer to the second SOI semiconductor wafer; and wafer thinning the first SOI semiconductor wafer and the second SOI semiconductor wafer subsequent to bonding. The step of wafer thinning the first SOI semiconductor wafer and the second SOI semiconductor wafer includes etching away a handle layer of the first SOI semiconductor wafer and a handle layer of the second SOI semiconductor wafer with a wet etch solution and using a buried oxide layer of each of the first and second SOI semiconductor wafers as an etch stop. The method further includes the step of etching a plurality of through holes in the capping component subsequent to wafer thinning to expose the conductive trace formed on the first SOI semiconductor wafer. The step of etching a plurality of through holes further comprises the step of using the buried oxide layer in the second SOI semiconductor as a hard mask during wet etching of the through holes and dry etching the capping layers remaining in the plurality of through holes to expose the conductive trace.

While an exemplary method of fabrication has been presented in the foregoing detailed description, it should be appreciated that additional method variations exist. It should also be appreciated that the exemplary method is only an example, and is not intended to limit the scope, applicability, or configuration of the invention in any way. Rather, the foregoing detailed description will provide those skilled in the art with a convenient road map for implementing the exemplary method. It should be understood that various changes can be made in the method steps without departing from the scope of the invention as set forth in the appended claims and the legal equivalents thereof.

What is claimed is:

1. A method of forming a microelectronic device comprising the steps of:

forming a sensor component, comprising a sensor structure and a conductive trace on a first SOI semiconductor wafer;

forming a capping component, comprising a capping layer on a second SOI semiconductor wafer;

bonding the first SOI semiconductor wafer to the second SOI semiconductor wafer such that the sensor structure is enclosed within a microcavity formed between the first and second SOI semiconductor wafers;

wafer thinning the first SOI semiconductor wafer and the second SOI semiconductor wafer subsequent to bonding first SOI semiconductor wafer to the second SOI semiconductor wafer by etching away a handle layer of the first SOI semiconductor wafer and a handle layer of the second SOI semiconductor wafer;

forming a through hole in the capping component to expose the conductive trace formed on the first SOI semiconductor wafer such that the conductive trace is external to the microcavity.

2. A method of forming a microelectronic device as claimed in claim 1 wherein the microelectronic device is a g-cell sensor (accelerometer).

3. A method of forming a microelectronic device as claimed in claim 1 wherein the step of forming a sensor component further includes the step of etching away a sacrificial material formed during fabrication of the sensor structure and the conductive trace to release the sensor structure and the conductive trace.

4. A method of forming a microelectronic device as claimed in claim 1 wherein the capping layer includes an oxide layer and a nitride layer.

5. A method of forming a microelectronic device as claimed in claim 1 wherein the second SOI semiconductor wafer comprises one of an active or sacrificial SOI semiconductor wafer.

6. A method of forming a microelectronic device as claimed in claim 1 wherein the step of bonding the first SOI semiconductor wafer to the second SOI semiconductor wafer includes forming a bonding material comprised of frit glass on a surface of the plurality of capping layers.

7. A method of forming a microelectronic device as claimed in claim 6 wherein the sensor structure is enclosed within a hermetically sealed area formed by the capping component, the bonding material and a surface of a field oxide layer deposited on an uppermost surface of the first SOI semiconductor wafer.

8. A method of forming a microelectronic device as claimed in claim 1 wherein the step of etching away a plurality of handle layers further includes the step of using a buried oxide layer of each of the first and second SOI semiconductor wafers as an etch stop.

9. A method of forming a microelectronic device as claimed in claim 1 wherein the step of forming a through hole further comprises the step of using the buried oxide layer in the second SOI semiconductor as a hard mask during wet etching of the through hole.

10. A method of forming a microelectronic device as claimed in claim 1 wherein the step of forming a through hole in the capping component further includes dry etching the plurality of capping layers to expose the conductive trace and provide for electrical connection.

11. A method of forming a microelectronic device comprising the steps of:

forming a sensor component, comprising a sensor structure and a conductive trace formed on a first wafer, the first wafer including a handle layer, a buried oxide layer and an active layer;

forming a capping component formed on a second wafer, the second wafer including a handle layer, a buried oxide layer;

bonding the first wafer to the second wafer such that the sensor component is enclosed within a microcavity formed between the first and second SOI semiconductor wafers;

etching away the handle layer of the first wafer and the handle layer of the second wafer subsequent to bonding the first wafer to the second wafer; and etching a through hole in the capping component using the buried oxide layer in the second wafer as a hard mask to expose the conductive trace formed on the first wafer, wherein the conductive trace is external to the microcavity.

12. A method of forming a microelectronic device as claimed in claim 11 wherein the microelectronic device is a g-cell sensor (accelerometer).

13. A method of forming a microelectronic device as claimed in claim 11 wherein the second wafer comprises one of an active or sacrificial SOI semiconductor wafer.

14. A method of forming a microelectronic device as claimed in claim 11 wherein the sensor structure is enclosed within a hermetically sealed area formed by the capping component, the bonding material and a surface of a field oxide layer deposited on an uppermost surface of the first wafer.

15. A method of forming a microelectronic device as claimed in claim 11 wherein the step of etching away the handle layer of the first wafer and the handle layer of the second wafer includes wet etching with tetramethylammonium (TMAH).

16. A method of forming a device comprising the steps of:
forming a sensor component on a first SOI semiconductor wafer;
forming a capping component on a second SOI semiconductor wafer;
bonding the first SOI semiconductor wafer to the second SOI semiconductor wafer; and
wafer thinning the first SOI semiconductor wafer and the second SOI semiconductor wafer subsequent to bonding.

17. A method of forming a device as claimed in claim 16 wherein the step of wafer thinning the first SOI semiconductor wafer and the second SOI semiconductor wafer includes etching away a handle layer of the first SOI semiconductor wafer and a handle layer of the second SOI semiconductor wafer with a wet etch solution and using a buried oxide layer of each of the first and second SOI semiconductor wafers as an etch stop.

18. A method of forming a device as claimed in claim 16 further includes the step of etching a through hole in the capping component subsequent to wafer thinning to expose the conductive trace formed on the first SOI semiconductor wafer.

19. A method of forming a device as claimed in claim 18 wherein the step of etching a through hole further comprises the step of using the buried oxide layer in the second SOI semiconductor as a hard mask during wet etching of the through hole and dry etching the capping layers remaining in the through hole to expose the conductive trace.

* * * * *